United States Patent
Eldridge et al.

(12)

(10) Patent No.: US 6,741,092 B2
(45) Date of Patent: May 25, 2004

(54) METHOD AND SYSTEM FOR DETECTING AN ARC CONDITION

(75) Inventors: Benjamin N. Eldridge, Danville, CA (US); Stefan Jan Juergen Zschiegner, San Jose, CA (US)

(73) Assignee: FormFactor, Inc., Livermore, CA (US)

( * ) Notice: Subject to any disclaimer, the term of this patent is extended or adjusted under 35 U.S.C. 154(b) by 148 days.

(21) Appl. No.: 10/035,364

(22) Filed: Dec. 28, 2001

(65) Prior Publication Data

US 2003/0122568 A1 Jul. 3, 2003

(51) Int. Cl.[7] .............................................. G01R 31/02
(52) U.S. Cl. ...................................... 324/765; 324/754
(58) Field of Search ................................. 324/754, 765, 324/158.1, 758, 72.5, 755, 761, 757; 438/17, 18, 19; 204/192.13

(56) References Cited

U.S. PATENT DOCUMENTS

| | | | |
|---|---|---|---|
| 5,789,926 A | * | 8/1998 | Badenlou ..................... 324/536 |
| 5,993,615 A | * | 11/1999 | Abry et al. ............ 204/192.13 |
| 6,441,629 B1 | * | 8/2002 | Khoury et al. .............. 324/757 |

* cited by examiner

*Primary Examiner*—Evan Pert
*Assistant Examiner*—Jimmy Nguyen
(74) *Attorney, Agent, or Firm*—N. Kenneth Burraston; Stuart L. Merkadeau

(57) ABSTRACT

A method and apparatus for detecting an arc condition in a semiconductor test system is disclosed. While probes in a semiconductor test system are being moved into or out of contact with a semiconductor wafer, the voltage level of power supplied to selected ones of the probes is monitored. If the voltage level of the power exceeds a level that could cause an arc between the probes and the semiconductor wafer while the wafer is being moved, an indication is generated that an arc condition has been detected.

21 Claims, 3 Drawing Sheets

METHOD AND SYSTEM FOR DETECTING AN ARC CONDITION

FIELD OF THE INVENTION

The present invention relates generally to detection of an arc condition.

BACKGROUND OF THE INVENTION

As is known, integrated electronic circuits or "chips" are manufactured as dice on a semiconductor wafer. After manufacture of a wafer, each die on the wafer is subjected to functionality tests to identify defective dice and/or to rate properly functioning dice.

FIG. 1 illustrates a common system for testing semiconductor wafers. A prober 124 includes a boat 120 for storing wafers. A robotic arm 122 moves the wafers between the boat 120 and a stage 118. Once a wafer 116 is placed on the stage 118, the stage is moved such that dice on the wafer contact probes 114 on a probe card assembly 112. Numerous electrical connections 110 connect the probe card assembly 112 to a test head 108. A tester 102 controls testing of a wafer 116. Communication cables 104 and 106 connect the tester 102 to the test head 108 and the prober 124.

The tester 102 controls testing of a wafer 116 by sending commands to the prober 124 and commands and test data to the test head 108 via communication cables 104 and 106. The tester 102 also receives status from the prober 124 and status and response data generated from the test head 108 also via communication cables 104 and 106.

To test wafers, the tester 102, which is typically a computer, executes a test program designed specifically for the wafers. A typical test program begins by sending commands to the prober 124 to remove a wafer from the boat 120 and place the wafer on the stage 118. The test program then sends commands to the prober 124 causing the stage 118 to move the wafer 116 into contact with the probes 114 of the probe assembly 112. The test program then sends test data to the test head 108. The test data is input to dice on the wafer 116 via the probe assembly 112. Response data generated by the dice on the wafer 116 is output from the dice through the probe card assembly 112 to the test head 108, from where it is sent to the tester 102. The tester 102 then evaluates the test data, determining whether the tested dice are functional or defective and sometimes rating the tested dice.

Because a typical probe assembly 112 does not have enough probes 114 to contact all of the dice on a wafer 116, the stage 118 must repeatedly move the wafer with respect to the probe elements. Thus, once the dice on wafer 116 in contact with probes 114 are tested, the tester 102 issues commands to the prober, causing the stage 118 to reposition the wafer 116 so that the probes 114 contact other as yet untested dice on the wafer.

Among the signals communicated to the dice on wafer 116 via probes 114 are power signals to provide power to the dice. If, however, power is applied to any of probes 114 as the wafer 116 is being moved either into contact with the probes or out of contact with the probes, an arc of electricity may jump the gap between the probes and the contact pads on the dice. Such an arc can damage the probes, the contact pads on the dice, or both. Although arcing is most likely to occur where probes 114 are delivering power to the dice, arcing may also occur where probes are delivering data or other types of signals to the dice. It is thus important that the test program executed by the tester 102 cause the test head 108 to power down at least those probes 114 that are delivering power to the dice while the stage 118 is moving the wafer 116. It may also be helpful to power down all probes 114 while the stage 118 is moving the wafer 116.

SUMMARY OF THE INVENTION

While probes in a semiconductor test system are being moved into or out of contact with a semiconductor wafer, the voltage level of power supplied to selected ones of the probes is monitored. If the voltage level of the power exceeds a level that could cause an arc between the probes and the semiconductor wafer while the wafer is being moved, an indication is generated that an arc condition has been detected.

DETAILED DESCRIPTION OF EMBODIMENTS OF THE INVENTION

The present invention relates to detection of an arc condition. This specification describes exemplary embodiments and applications of the invention. The invention, however, is not limited to these exemplary embodiments and applications or to the manner in which the exemplary embodiments and applications operate or are described herein.

Figure 2:
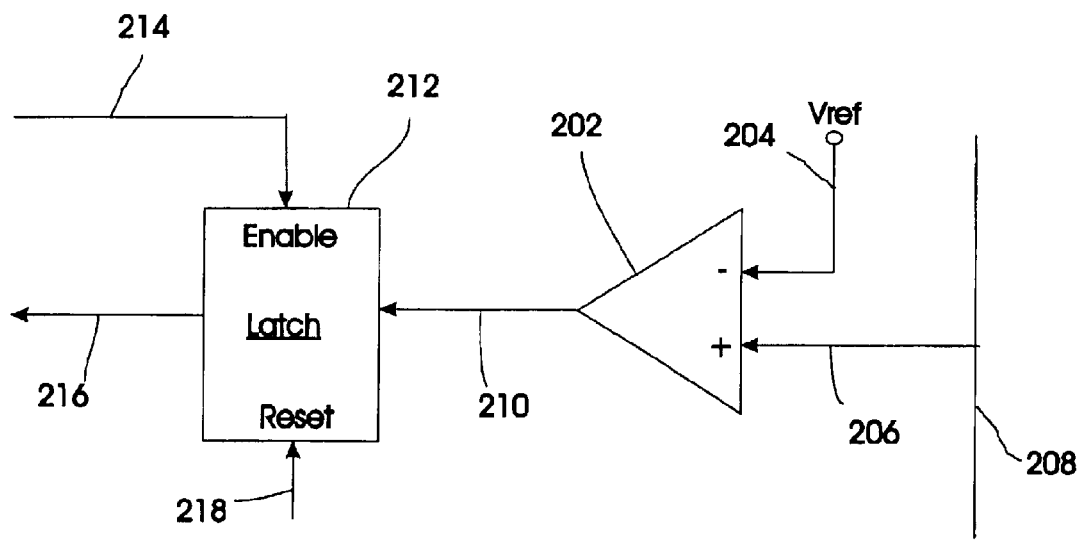
FIG. 2 illustrates an exemplary circuit for detecting an arc condition.

FIG. 2 illustrates a first exemplary embodiment of the invention. The exemplary circuit shown in FIG. 2 comprises a comparator 202 and a latch 212. One (−) input 204 of the comparator 202 is connected to a reference voltage $V_{ref}$. The other (+) input 206 of the comparator 202 is connected to a power source 208 that supplies power to a probe 114. During testing of a semiconductor wafer, power is supplied through the probe card assembly to certain probe elements to provide power to the dice being tested. The (+) input 206 of comparator 202 may be connected directly to such a power source or may be connected to the connection line or plane through which the power source delivers power to the probe. Element 208 in FIG. 2 refers to an output of the power supply itself and/or the line or plane through which the power is delivered to the probe.

Comparator 202 may be a standard comparator known in the electronics field. As is known, whenever the voltage on the (+) input 206 connected to the power supply 208 rises to within a value near or above the reference voltage $V_{ref}$ (the signal on the (−) input 204 to comparator 202), the output 210 comparator 202 becomes "true" (the term "true" referring to the state of the output 210 of comparator 202 indicating that the voltage level on the (+) input 206 is approximately equal to or greater than the voltage on the (−) input 204 regardless of whether this results in a high or a low level voltage state at the output 210). On the other hand, whenever the voltage on the (+) input 206 connected to the power supply 208 is sufficiently below the reference voltage $V_{ref}$, the output 210 of comparator 202 is "false." $V_{ref}$ is set to a voltage level that could cause arcing if the voltage level appeared on the power source 208 while the probes 114 where being brought into or out of contact with a wafer 116. The output 210 of comparator 202 thus becomes "true" whenever the voltage on the power source 208 is sufficiently high to cause arcing. Typically, $V_{ref}$ is less than the power supply voltage. The typical voltage of a power supply for supplying power to a probe may vary depending on the particular application. As two nonlimiting examples, in a particular application, the voltage may be about 50 millivolts; in other applications the voltage may be about 5 volts. Other voltages are contemplated, and the invention is not limited to use with power supplies supplying voltages between 50 millivolts and 5 volts but may be used with power supplies supplying less than 50 millivolts or greater than 5 volts.

As also shown in FIG. 2, the output 210 of comparator 202 is the input to latch 212. Latch 212 may be a standard latch known in the electronics field. Preferably, the latch 212 is configured so that, if at any time the input 210 becomes "true" while the enable input 214 to latch 212 is "enabled," the output 216 of latch 212 will become "true" and remain "true" until reset by a "reset" signal received at the reset input 218. When the latch enable 214 is "enabled," the output 210 of comparator 202 is latched into the latch 212 and appears on the output 216 of latch 212. The latch enable 214 is enabled only while the stage 118 is moving a wafer 116 into or out of contact with probes 114. Reset signal 218 resets the state of output 216 of latch 212 to a "false" state (the term "false" corresponding to the state of the output 210 of comparator 202 indicating that the voltage level at the (+) input 206 of the comparator 202 is less than the voltage at the (−) input 204). A separate circuit like the one shown in FIG. 2 may be used for every power source 208 connected to probes 114. Such circuits may also be used to monitor the voltage on electrical lines connected to probes 114 that deliver data or other signals to the dice and generate a warning signal upon detection of an arc condition.

In one mode of operation, prior to the wafer 116 being moved into or out of contact with probes 114, the reset signal 218 to latch 212 is temporarily activated to reset output 216 of latch 212 to a "false" state. After the reset signal 218 is deactivated, the enable signal 214 is activated to enable latch 212. Then, the wafer 116 is moved into contact or out of contact, as the case may be, with the probes 114. Because the latch enable 214 is "enabled," the output 210 of comparator 202 is latched into latch 212 and appears on the output 216 of latch 212. Once the move of wafer 116 has been completed, the latch enable signal 214 is "disabled." Thereafter, the output 216 of latch 212 is frozen because the output 210 of comparator 202 will no longer be latched into latch 212. Thus, while the wafer 116 is being moved into or out of contact with the probes 114, the output 216 of latch 216 remains "false" as long as the voltage from the power source 208 stays below $V_{ref}$. If, however, the voltage from the power source 208 rises above $V_{ref}$ during the move of the wafer 116, the output 210 of comparator 202 becomes "true," and this state of output 210 is latched into latch 212 and appears on the output 216 of latch 212. The output 216 of latch 212 thus indicates whether a voltage sufficient to cause arcing appeared on the power source 208 during the move of the wafer 116. Although not shown in FIG. 2, the output 216 of latch 212 may be connected to a warning indicator, such as a light (e.g., a light emitting diode), buzzer, or other warning device to indicate detection of an arc condition.

Although not shown in FIG. 2, a memory for storing data regarding the arc condition may be included. Nonexclusive examples of data that might be stored include the voltage level detected on the power source 208, an identification of the probe to which the power source 208 is connected, an identification of the power source 208, etc. Provision may also be made for reading such data from the memory to an output device or for transmitting such data to another device, such as the tester 102. The detection of an arc condition as well as any related data may be used to debug a test program running on the tester 102. Indeed, a typical tester 102 includes debugging tools; accordingly, the detection of the arc condition and any related data may be made available to such debugging tools.

Although also not shown in FIG. 2, circuitry may be included for disabling latch 212 upon detection that the output 210 of comparator 202 became "true" and was latched into latch 212. Such circuitry, although not necessary, would cause even a momentary power surge on power source 208 during the move of the wafer 116 to cause an arc condition state of output 216 of latch 212 to be captured at output 216.

Figure 3:
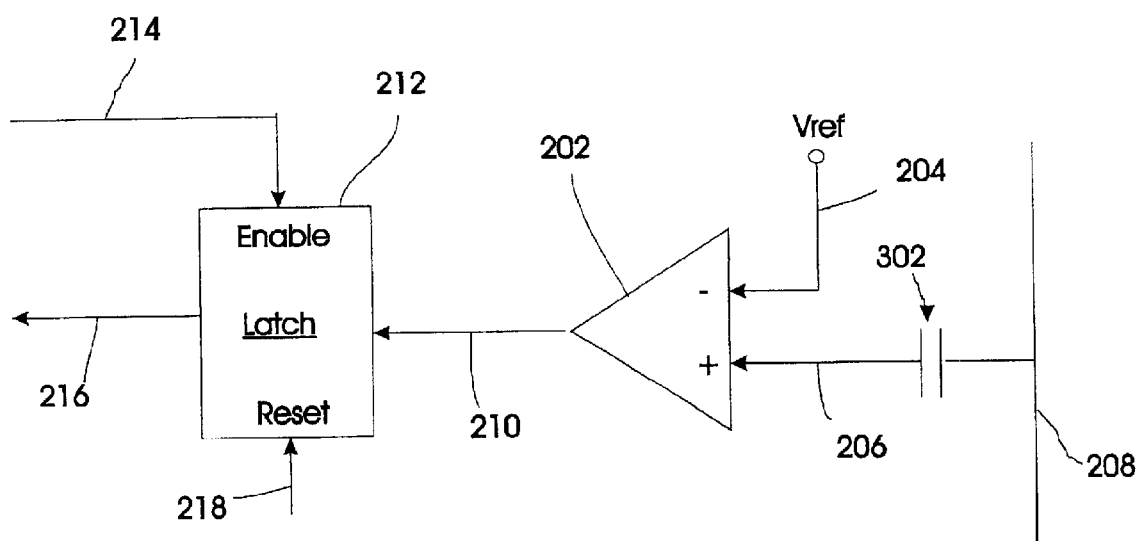
FIG. 3 illustrates another exemplary circuit for detecting an arc condition.

FIG. 3 illustrates a variation of the circuit shown in FIG. 2. The circuit shown in FIG. 3 is similar to the circuit shown in FIG. 2 except that the (+) input 206 of comparator 202 in the circuit shown in FIG. 3 is not directly connected to power source 208. Rather, the (+) input 206 is indirectly connected to power source 208 through a capacitor 302. Capacitor 302 may be a discrete capacitor or may be formed of parallel plates separated by a dielectric material formed on a substrate on which the circuit is disposed. Alternatively, the (+) input 206 may be inductively coupled to the power source 208. Indirect coupling may protect the comparator 202 and the latch 212 from current spikes caused by a sudden voltage change on the power source 208. Indirect coupling may also limit leakage currents into the comparator, which could interfere with testing of the dice.

Figure 4:
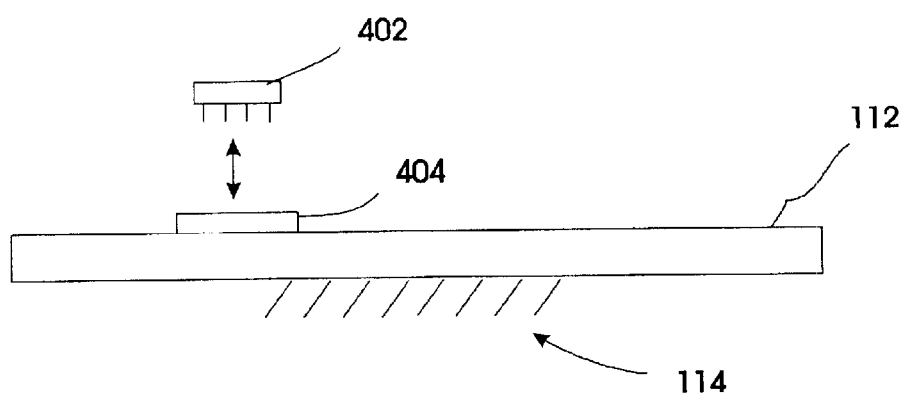
FIG. 4 illustrates an exemplary probe card assembly.

In a preferred embodiment, the circuit illustrated in FIG. 2 or FIG. 3 is disposed on the probe card assembly 112. As shown in FIG. 4, the circuit may be formed on a substrate 402 that can by plugged into a socket 404 on the probe card assembly 112. In such a case, the circuit substrate 402 can be plugged into the socket 404 when needed and removed when not needed. Alternatively, the circuit illustrated in FIG. 2 or FIG. 3 may be permanently attached to the probe card assembly 112. In should be apparent that the location of the circuit illustrated in FIG. 2 or FIG. 3 is not critical; thus, the circuit may be located in other places. As just one example, the circuit may be located other than on the probe card assembly 112, with electrical leads (not shown) connecting the circuit to the probe card assembly 112.

Figure 5:
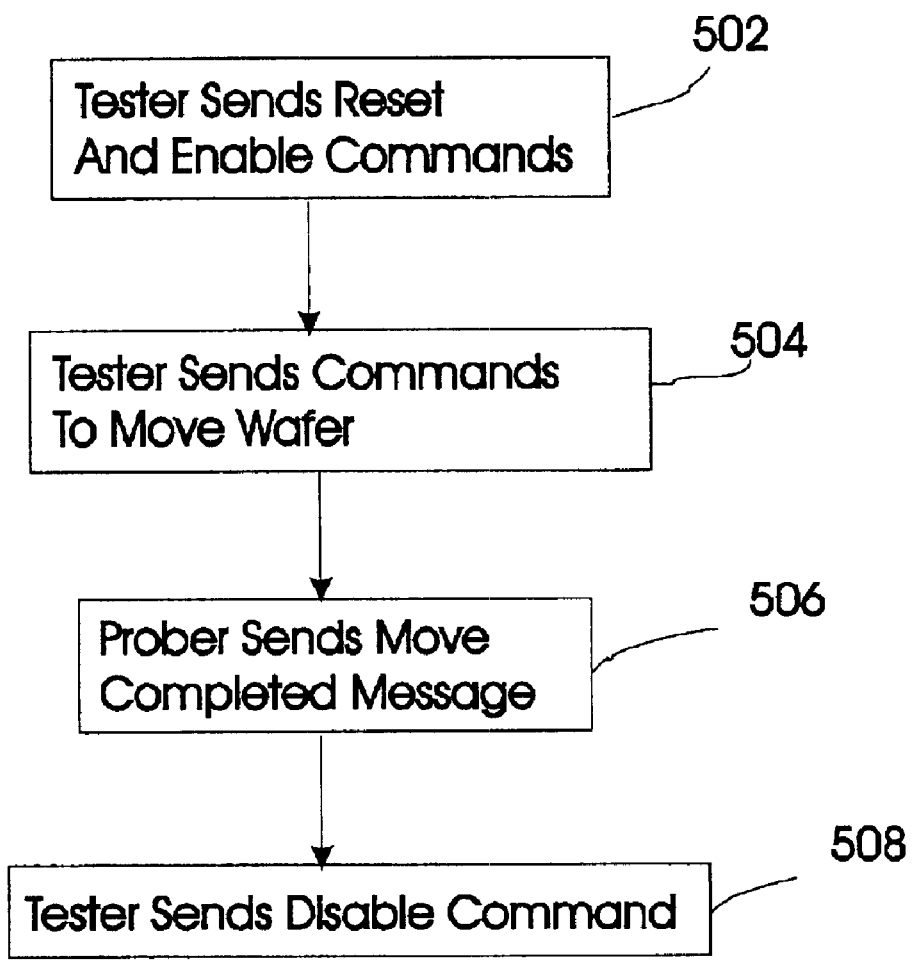
FIG. 5 illustrates a flow of exemplary actions for monitoring an arc condition.

FIG. 5 illustrates a flow chart generally illustrating an exemplary flow of actions that may be taken by the tester 102 to control a circuit such as the one shown in FIG. 2 or FIG. 3. In the exemplary sequence of actions shown in FIG. 5, the tester 102 initially sends a command or commands to the test head 108 via communication channel 104 to reset and then enable latch 212. This step is labeled 502 in FIG. 5. Thereafter, the tester 102 sends one or more commands to the prober 124 via communication channel 106 to move the stage 118 and thereby move wafer 116. This step is labeled 504 in FIG. 5. Once the prober 124 completes the move, the prober sends a message to the tester 102 via communication channel 106 that the move has been completed 506. Once the move has been completed, the tester 102 sends a command to the test head 108 via communication channel 104 to disable latch 212. The latch 212 may also be reset. This step is labeled 508 in FIG. 5. Of course, during or between any of the general actions shown in FIG. 5, additional handshaking messages may be exchanged between the tester 102, on one hand, and the prober 124 or the test head 108, on the other hand.

As explained above, if the voltage on the power source 208 rises during the move to a level that could cause arcing, the output 216 of latch 212 becomes "true." If this occurs, the test head 108 sends a message to the tester 102 via communication channel 104 that an arc condition has been detected on the probe card assembly 112. The tester 102 may then take appropriate action. Nonexclusive examples of appropriate actions include displaying a warning message to an operator, interrupting the test of the wafer 116, etc.

As mentioned above, the sequence of actions illustrated in FIG. 5 is exemplary only. Many modifications to the sequence could be made, and other sequences of actions that reset and enable latch 212 prior to a move of stage 118 and then disable latch 212 after the move could be used instead. As just one example, the prober 124, upon receiving move commands from tester 102, could communicate to the test head 108 the need to reset and enable latch 212. After completing the move of stage 118, the prober 124 could then communicate to the test head 108 the need to disable latch 212. In the foregoing example, the prober 124—rather than the tester 102—directly controls the circuit illustrated in FIG. 2 or FIG. 3.

It should be apparent that the location of the circuit illustrated in FIG. 2 or FIG. 3 is not critical. Although described above as located on the probe card assembly 112, the circuit could alternatively be located in the tester 102, test head 108, or prober 124, with appropriate communication of the voltage level on power source 208 from the test head 108 to wherever the circuit is located. As yet another alternative, the circuit could be located on an entity (not shown in any figure) that is separate from but communicatively connected to the tester 102, test head 109, or prober 124.

It should also be apparent that the circuit illustrated in FIG. 2 or FIG. 3 could alternatively be implemented in software. For example, the voltage level on the power source 208 could be converted to a digital value by an analog-to-digital converter and the output of the analog-to-digital converter monitored by software. While an enable flag is set indicating that a move of the stage 124 is taking place, the software would set a flag indicating that an arc condition was detected if the digitized power source voltage rose above a predetermined level. The software could include appropriate controls to reset the arc condition detected flag prior to a move. Such software may run at the tester 102, the test head 108, the prober 124, or another device in communication with the test system. Of course, such software could run on a combination of one or more of the foregoing devices.

It should be noted that the exemplary circuit illustrated in FIG. 2 or FIG. 3 is most advantageously used to test and debug a new test program being developed to test a particular wafer. The exemplary circuit may, however, be used during routine testing of wafers.

Figure 1:
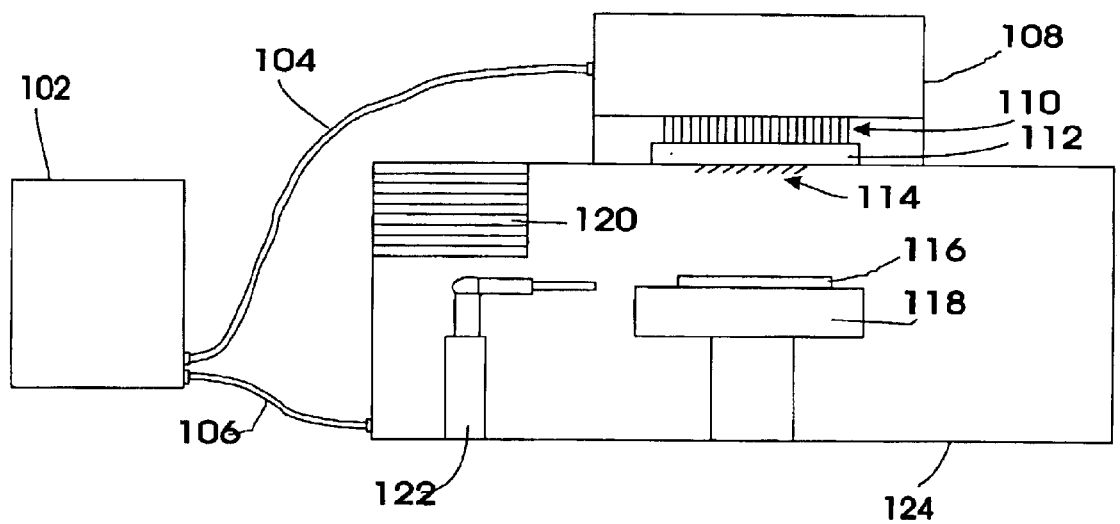
FIG. 1 illustrates an exemplary system for testing semiconductor wafers.

It should be apparent that FIG. 1 illustrates an exemplary semiconductor test system. The present invention may be used with semiconductor test systems configured in ways other than shown in FIG. 1.

Although the principles of the present invention have been illustrated and explained in the context of specific embodiments, it will be appreciated by those having skill in the art that various modifications beyond those illustrated can be made to the disclosed embodiments without departing from the principles of the present invention. For example, configurations of the exemplary circuits illustrated in FIGS. 2 and 3 in which a reference voltage is input into the (+) input and the power source 208 is input into the (−) input of a comparator may be used. For example such a configuration could be used to monitor a power supply voltage that may be less than zero and detect an arc condition where the power supply voltage (a negative voltage) is less than (but whose absolute value is greater than the absolute value of) a negative reference voltage. A power supply to an analog die, which typically provides symmetrical power centered at zero volts, is just one example in which monitoring a negative voltage may be useful. As another example of a modification that may be made to the above-described exemplary embodiments, the circuits shown in FIGS. 2 and 3 could be configured with the reference voltage on the (+) voltage and the power source 208 on the (−) voltage and an inverter placed on the output of the comparator 202. All such modifications to and departures from the disclosed embodiments are deemed to be within the scope of the following claims.

What is claimed is:

1. An apparatus comprising:
   a comparator having an input connected to a reference voltage and another input connected to a power source to a test probe for contacting a semiconductor wafer;
   a latch having an input connected to an output of said comparator;
   enabling means for enabling said latch only in connection with a move of said wafer with respect to said probe; and
   signaling means for signaling an arc condition if said output of said latch indicates that said output of said comparator was triggered while said latch is enabled.

2. The apparatus of claim 1, wherein said reference voltage corresponds to a voltage level sufficient to cause an arc between said probe and said wafer.

3. The apparatus of claim 1, wherein said enabling means enables said latch prior to said move of said wafer and disables said latch after completion of said move.

4. The apparatus of claim 1, wherein said signaling means activates an indicator.

5. The apparatus of claim 1, wherein said signaling means lights a light.

6. The apparatus of claim 1, wherein said signaling means sends a message.

7. The apparatus of claim 1 further comprising:
   a plurality of said comparators, each having an input connected to said reference voltage and another input connected to a power source to one of a plurality of said test probes; and
   a plurality of said latches, each having an input connected to an output of one of said comparators.

8. The apparatus of claim 1, wherein said another of said inputs of said comparator is indirectly connected to said power source to said test probe.

9. The apparatus of claim 8, wherein said another of said inputs of said comparator is capacitively connected to said power source to said test probe.

10. The apparatus of claim 1, wherein
    said test probe is disposed on a probe card assembly, and
    said comparator and said latch are disposed on a substrate that is pluggable into a socket on said probe card assembly.

11. An apparatus for testing a semiconductor wafer, said apparatus comprising:
    moving means for moving said wafer into and out of contact with probes of a probe card assembly;

monitoring means for monitoring a voltage level of power supplied to one of said probes;

signaling means for signaling an arc condition if said voltage exceeds a predetermined threshold during a move of said wafer.

12. The method of claim 11, wherein:

said monitoring means further monitors voltage levels of power supplied to a plurality of said probes; and said signaling means further signals an arc condition if said voltage of power supplied to at least one of said probes exceeds said predetermined threshold.

13. A method for use in a system for testing a semiconductor wafer, said system comprising a stage for moving said wafer into and out of contact with a plurality of probes, said method comprising:

monitoring a voltage on a power source to one of said probes; and if said voltage exceeds a predetermined threshold during a move of said stage, signaling an arc condition.

14. The method of claim 13, wherein said monitoring comprises comparing said voltage on said power source to a reference voltage.

15. The method of claim 14, wherein said signaling an arc condition comprises enabling an output of a result of said comparing during said move of said stage.

16. The method of claim 15, wherein said enabling comprises:

receiving an indication that a move of said stage is to take place; and enabling said output of said result in response to said indication that a move of said stage is to take place.

17. The method of claim 16, wherein said enabling further comprises:

receiving an indication that said move has been completed; and disabling said output of said result in response to said indication that said move has been completed.

18. The method of claim 13, wherein said signaling an arc condition comprises activating an indicator.

19. The method of claim 13, wherein said signaling an arc condition comprises lighting a light.

20. The method of claim 13, wherein said signaling an arc condition comprises sending a message.

21. The method of claim 1 further comprising:

monitoring voltages on a plurality of power sources to a plurality of said probes; and if at least one of said voltages exceeds a predetermined threshold during said move of said stage, signaling an arc condition.

* * * * *